(12) United States Patent
Wang et al.

(10) Patent No.: US 7,982,370 B2
(45) Date of Patent: Jul. 19, 2011

(54) FLEXIBLE NANOGENERATORS

(75) Inventors: Zhong L. Wang, Marietta, GA (US); Xudong Wang, Atlanta, GA (US); Yong Qin, Atlanta, GA (US); Rusen Yang, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 287 days.

(21) Appl. No.: 12/209,310

(22) Filed: Sep. 12, 2008

(65) Prior Publication Data

US 2009/0066195 A1     Mar. 12, 2009

Related U.S. Application Data

(60) Provisional application No. 60/971,616, filed on Sep. 12, 2007, provisional application No. 61/033,642, filed on Mar. 4, 2008.

(51) Int. Cl.
*H02N 2/18* (2006.01)

(52) U.S. Cl. .......................... 310/339; 310/367

(58) Field of Classification Search .............. 310/339; 257/43; *H02N 2/18; H01L 41/107*
See application file for complete search history.

(56) References Cited

U.S. PATENT DOCUMENTS

| | | | |
|---|---|---|---|
| 4,310,957 A * | 1/1982 | Sachs | 29/25.35 |
| 6,998,689 B2 | 2/2006 | Kley | |
| 7,047,800 B2 | 5/2006 | Thiesen et al. | |
| 2002/0078716 A1 * | 6/2002 | Machida et al. | 66/218 |
| 2002/0148518 A1 * | 10/2002 | Lindler et al. | 137/625.65 |
| 2003/0041672 A1 * | 3/2003 | Hajduk et al. | 73/800 |
| 2003/0089899 A1 | 5/2003 | Lieber et al. | |
| 2004/0133092 A1 | 7/2004 | Kain | |
| 2005/0009224 A1 | 1/2005 | Yang et al. | |
| 2005/0034529 A1 * | 2/2005 | Tang et al. | 73/777 |
| 2005/0127677 A1 * | 6/2005 | Luttrull | 290/1 R |
| 2006/0254501 A1 * | 11/2006 | Wang et al. | 117/68 |
| 2007/0111368 A1 | 5/2007 | Zhang et al. | |
| 2008/0067618 A1 * | 3/2008 | Wang et al. | 257/415 |
| 2008/0161796 A1 | 7/2008 | Cao et al. | |

FOREIGN PATENT DOCUMENTS

| | | |
|---|---|---|
| WO | 2004032191 A2 | 4/2004 |
| WO | 2006138671 A2 | 12/2006 |

OTHER PUBLICATIONS

Jeon et al., "MEMS power generator with transverse mode thin film PCT," Science Direct, vol. 122, Issue 1, Jul. 29, 2005, pp. 16-22.

(Continued)

*Primary Examiner* — Thomas M Dougherty
*Assistant Examiner* — Bryan P Gordon
(74) *Attorney, Agent, or Firm* — Bryan W. Bockhop; Bockhop & Associates, LLC

(57) ABSTRACT

A small scale electrical generator includes an elongated substrate and a first piezoelectric fine wire. The first piezoelectric fine wire is disposed along a surface of the substrate. The first piezoelectric fine wire has a first end and a spaced-apart second end. A first conductive contact secures the first end of the fine wire to a first portion of the substrate and a second conductive contact secures the second end of the fine wire to a second portion of the substrate. A fabric made of interwoven strands that includes fibers from which piezoelectric nanowires extend radially therefrom and conductive nanostructures extend therefrom is configured to generate electricity.

13 Claims, 4 Drawing Sheets

OTHER PUBLICATIONS

Gao et al., Nanoarchitectures of semiconducting and piezoelectric zinc oxide, J. Applied Physics 97, 044304 (2005).

Wang et al., "Large-Size Liftable Inverted-Nanobowl Sheets as Reusable Masks for Nanolithography," Nano Letters, vol. 5, No. 9, 2005, 1748-1788.

Lao et al., "Formation of double-side teethed nanocombs of ZnO and self-catalysis of Zn-terminated polar surface," Chemical Physics Letters, Elsevier B.V., 2005.

Jeon et al., "MEMS power generator with transverse mode thin film PZT," Sensors and Actuators A Physical, Elsevier, (2005).

Lao et al., "Formation of double-side teethed nanocombs of ZnO and self-calalysis of Zn-terminated polar surface," Chemical Physics Letters (Science Direct), (Abstract), 2007.

Wang et al., "Large-Size Liftable Inverted-Nanobowl Sheets as REusable Masks for Nanolithography," Nano Letters, vol. 5, (Abstract), 2005.

Wang et al., "Piezoelectric Nanogenerators Based on Zinc Oxide Nanowire Arrays," Science, vol. 312, pp. 242-245, Apr. 14, 2006.

Peck-Radosavjevic et al., "Thrombopoietin induces rapid resolution of thrombocytopenia after orthotopic liver transplantation through increased platelet production," Blood, vol. 95, No. 3, (2000).

* cited by examiner

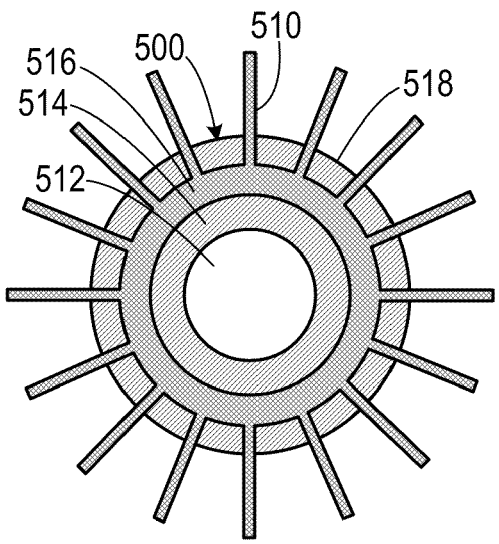
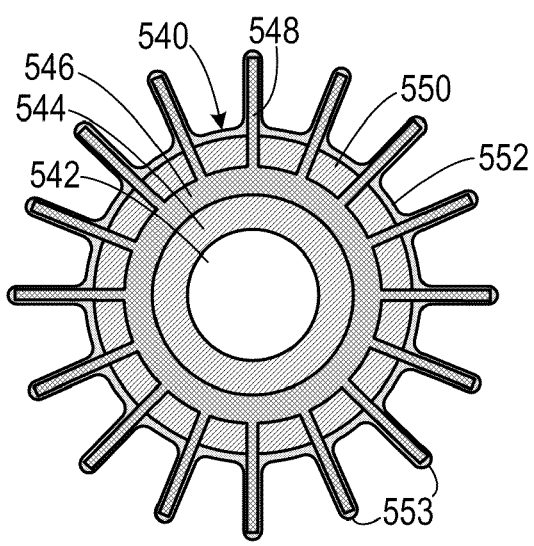
FIG. 5A  FIG. 5B
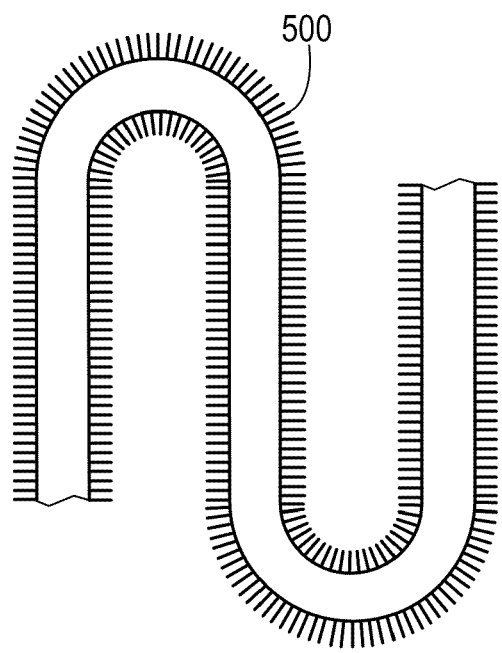
FIG. 5C
FIG. 5D

FLEXIBLE NANOGENERATORS

CROSS-REFERENCE TO RELATED APPLICATION(S)

This application claims the benefit of U.S. Provisional Patent Application Ser. Nos. 60/971,616, filed Sep. 12, 2007, and 61/033,642, filed Mar. 4, 2008, the entirety of each of which is hereby incorporated herein by reference.

STATEMENT OF GOVERNMENT INTEREST

This invention was made with support from the U.S. government under grant number DE-FG02-07ER46394, awarded by the Department of Energy and grant number DMR-9733160, awarded by the National Science Foundation and grant number DMS-0706436, awarded by the National Science Foundation and grant number 1U54CA119338, awarded by the National Institutes of Health

BACKGROUND OF THE INVENTION

1. Field of the Invention

The present invention relates to electrical power generators and, more specifically, to flexible substrate-based nano-generators.

2. Description of the Prior Art

Many systems require locally stored or generated electrical power to power local devices used in a variety of applications. For example, many military systems require electrical power for small scale communication and sensor systems. As another example, many medical systems employ mobile monitors and stimulators to detect and treat medical conditions of patients as they live their normal lives.

While batteries may provide the power in many such applications, batteries can be heavy and inconvenient. Also, some battery powered systems require frequent recharging.

A considerable amount of energy is transferred to ordinary objects through their normal use. For example, the individual threads in a person's clothing are in almost constant relative motion when the person is on the go. While the relative displacement of the threads is often on a microscopic scale, such movement involves a considerable amount of energy. Unfortunately, there is currently no practical method of harvesting such energy.

Therefore, there is a need for a flexible generator that can be embedded with systems requiring electrical energy.

SUMMARY OF THE INVENTION

The disadvantages of the prior art are overcome by the present invention which, in one aspect, is a small scale electrical generator that includes an elongated substrate and a first piezoelectric fine wire. The first piezoelectric fine wire is disposed along a surface of the substrate. The first piezoelectric fine wire has a first end and a spaced-apart second end. A first conductive contact secures the first end of the fine wire to a first portion of the substrate and a second conductive contact secures the second end of the fine wire to a second portion of the substrate.

In another aspect, the invention is a fibrous electrical generator that includes a first elongated strand and a second elongated strand. A plurality of piezoelectric nanowires extends radially outwardly from the first elongated strand. Each piezoelectric nanowire includes a proximal end secured to the first elongated strand and an opposite distal end. A first conductive contact is in electrical communication with the first elongated strand. The second elongated strand is intertwined with the first elongated strand. Each second elongated strand includes a plurality of elongated conductive nanostructures extending radially outwardly therefrom. Each of the plurality of conductive nanostructures has a first end secured to the second elongated strand and a opposite second end. A second conductive contact is in electrical communication with the second elongated strand. The second elongated strand is disposed relative to the first elongated strand so that relative motion between the first elongated strand and the second elongated strand causes a set of the piezoelectric nanowires extending from the first elongated strand to bend, thereby creating a voltage potential differential across each of the set of piezoelectric nanowires, and so that a Schottky barrier is formed between at least one of the set of piezoelectric nanowires and at least one of the elongated conductive nanostructures, thereby causing a charge transfer from the at least one of the set of piezoelectric nanowires to the at least one of the elongated conductive nanostructures, thereby creating a voltage potential between the first conductive contact and the second conductive contact.

In another aspect, the invention is a method of making a small scale electrical generator, in which a first piezoelectric fine wire is placed on a substrate. A first end of the fine wire is secured to the substrate with a first conductive contact. A second end, spaced apart from the first end, of the first piezoelectric fine wire is secured to substrate with a second conductive contact.

In yet another aspect, the invention is a method of making an electrical generating fabric, in which a plurality of first elongated strands is intertwined with a corresponding plurality of second elongated strands to form a plurality of electrical generating yarns. Each of the first plurality of elongated strands includes a plurality of piezoelectric nanowires extending radially outwardly therefrom and each of the second plurality of elongated strands includes a plurality conductive nanostructures extending radially outwardly therefrom. The plurality of electrical generating yarns is woven together to form an electrical generating fabric.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

BRIEF DESCRIPTION OF THE FIGURES OF THE DRAWINGS

FIG. 5A is a cross-sectional view of a first strand.

FIG. 5B is a cross-sectional view of a second strand.

FIG. 5C is a schematic diagram of a first strand.

FIG. 5D is an elevational view of a first strand and a second strand intertwined to form a yarn.

DETAILED DESCRIPTION OF THE INVENTION

Figure 1A:
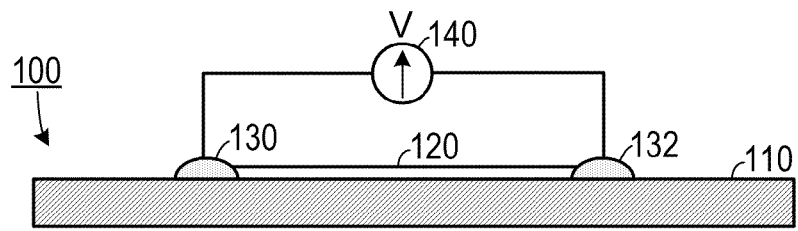
FIG. 1A is an elevational view of one embodiment of a flexible generator in an at-rest position.

A preferred embodiment of the invention is now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on." Also, as used herein, the term "piezoelectric fine wire" includes nano-scale piezoelectric wires and micro-scale piezoelectric wires. The term "wire" includes ribbons, rods and other elongated structures.

Relevant to the disclosure that follows, the growth of ZnO nanorods is disclosed in more detail in U.S. patent application Ser. No. 11/608,865, filed on Dec. 11, 2006 by Wang et al. and U.S. Pat. No. 7,220,310, issued on May 22, 2007 to Wang et al. and U.S. Pat. No. 7,351,607, issued on Apr. 1, 2008 to Wang et al., the entirety of each of which is hereby incorporated by reference. The making of fibers surrounded by ZnO nanorods is disclosed in more detail in U.S. patent application Ser. No. 12/194,943, filed on Aug. 20, 2008 by Wang et al., the entirety of which is also incorporated by reference.

As shown in FIG. 1, one embodiment is a flexible power generator 100 that is based on cyclic stretching-releasing of a piezoelectric fine wire 120 disposed on a flexible substrate 110. A first end of the piezoelectric fine wire 120 is secured to the substrate 110 by a first conductive contact 130 and a second end of the piezoelectric fine wire 120 is secured to the substrate by a second conductive contact 132. In one embodiment, the substrate could include a polyimide film (such as Kapton® film available from Dupont). The piezoelectric fine wire 120 could include a material such as zinc oxide and the first conductive contact 130 and the second conductive contact 132 could include a metal, such as silver.

Figure 1B:
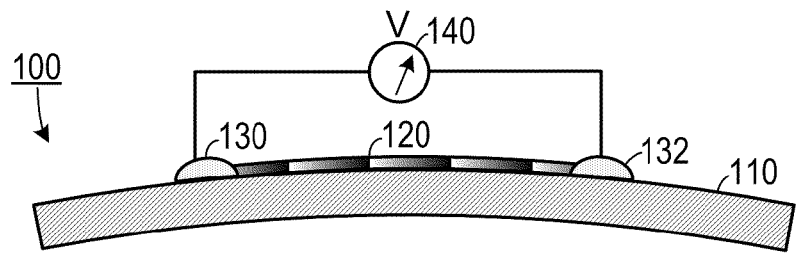
FIG. 1B is an elevational view of the embodiment shown in FIG. 1A in a flexed position.

As shown in FIG. 1B, when the substrate 110 is bent, the piezoelectric fine wire 120 is also bent, thereby inducing a charge differential across the piezoelectric fine wire 120, which results in a voltage potential between the first conductive contact 130 and the second conductive contact 132. Thus, the piezoelectric fine wire 120 acts as a charge pump that drives the back and forth flow of electrons in an external circuit to achieve a charging and discharging process when the piezoelectric fine wire is stretched and released, respectively.

The material of the first conductive contact 130 and the second conductive contact 132 is chosen so that a band gap exists between them and the piezoelectric fine wire 120. Thus, when the piezoelectric fine wire 120 is flexed, a Schottky barrier is created between the piezoelectric fine wire 120 and the first conductive contact 130 and the second conductive contact 132. Thus, the Schottky barrier is as a "gate" that prevents the flow of the electrons in the external circuit through the piezoelectric fine wire so that the piezoelectric potential is preserved. The barrier height of the "gate" can be in the order of that for an insulator, which is also effective for directing the electrons to flow in external circuit. The Schottky contact can be at one side or at both sides of the piezoelectric fine wire 120. The piezoelectric fine wire 120 acts like a "capacitor" and "charge pump," which drives the back and forth flow of the electrons in the external circuit to achieve a charging and discharging process when the piezoelectric fine wire is stretched and released, respectively. This means that the electrons will not flow through the piezoelectric fine wire 120, but back and forth in the external load. Therefore, the generated voltage does not need to exceed a critical value in order for the device to work. When the piezoelectric fine wire is stretched as driven by bending of the substrate, a piezoelectric-potential-drop is created along the piezoelectric fine wire, which raises the Fermi level of the electrode at the low-potential (LP) side and drives the forward-flow of electrons from the LP side through the external circuit to the high-potential (HP) side to balance the Fermi levels of the two electrodes. When the piezoelectric fine wire 120 is released, the disappearance of the piezoelectric potential in the piezoelectric fine wire 120 lowers the Fermi level of the LP side, leading to a back-flow of the electrons from the HP side to the LP side. A repeated stretching-releasing of a single piezoelectric fine wire 120 creates a transient voltage of, for example, up to about 50 mV.

In one experimental embodiment, a repeated stretching-releasing of a single piezoelectric fine wire 120 with strain of 0.05-0.1% created an oscillating output voltage up to about 50 mV. The energy conversion efficiency of the wire itself was about 6.8%. This embodiment was also shown to be washable, thereby lending itself to textile-based applications.

In this embodiment, the flexible generator was fabricated by bonding a ZnO piezoelectric fine wire 120 laterally on the substrate 110. The ZnO piezoelectric fine wires were synthesized by a physical vapor deposition method, and typically had diameters of about 3-5 µm and lengths of about 200-300 µm. The thickness of the polyimide film was 50 µm. Initially, the film was washed with acetone, isopropyl alcohol, and ethanol under sonication. After that, the polyimide film was prepared for use as substrate by dry cleaning using nitrogen gas and baking at 150° C. for 10 minutes. ZnO piezoelectric fine wire was placed flat on the polyimide film using a probe station under optical microscope. Silver paste was applied at both ends of the ZnO piezoelectric fine wire to fix its two ends tightly on a flexible substrate. An external circuit 140, such as a current/voltage measurement meter, was connected to two ends of the piezoelectric fine wire 120 without introducing any external power source in the circuit 140.

To measure the electric energy generated by the piezoelectric fine wire 120 when subjected to mechanical deformation, a periodic mechanical bending was introduced to the substrate 110 using a motor driven mechanical arm. The final bend radius of the substrate was about 2 cm, which is much larger than the length of the piezoelectric fine wire 120. In addition, the thickness of the polyimide substrate 110 was much larger than the diameter of the piezoelectric fine wire 120. As a result, the bending of the substrate film induced a tensile strain of 0.05-0.1% in the piezoelectric fine wire 120. Due to the piezoelectric property of ZnO, a piezoelectric potential field was created along the piezoelectric fine wire 120, which drove the flow of electrons in the external circuit 140. When the substrate was periodically bent and released, the piezoelectric fine wire was periodically stretched and released, resulting in an alternating current.

Figure 2:
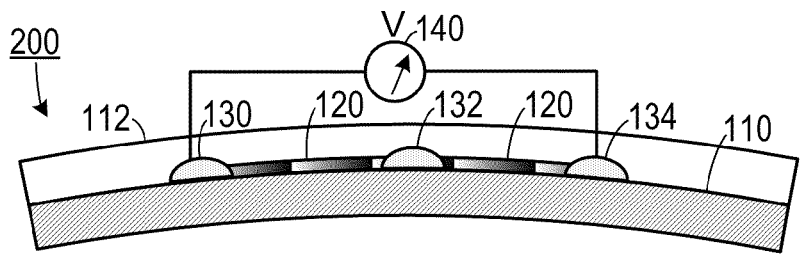
FIG. 2 is an elevational view of a multi-strand embodiment of a flexible generator in a flexed position.

As shown in FIG. 2, more than one piezoelectric fine wire 120 may be coupled in series. For example, a second piezoelectric fine wire 120 may be coupled to the second contact 132 and secured to the substrate 110 by a third conductive contact 134. Generators configured in this manner can raise the output voltage.

Figure 3:
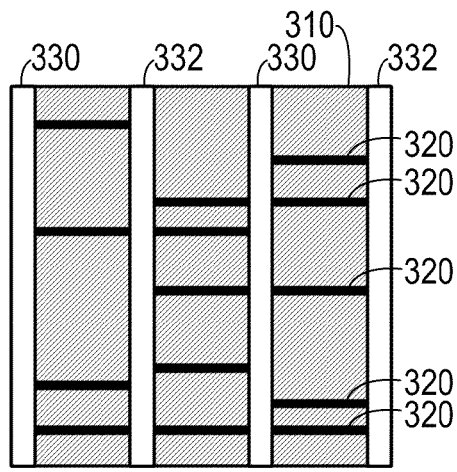
FIG. 3 is a plan view of a multi-strand embodiment of a flexible generator employing multiple electrodes.

As shown in FIG. 3, a plurality of piezoelectric fine wires 320 (which may include fine wires of varying lengths) may be placed on a substrate 310. A fine fibrous felt or brush can be drawn across the piezoelectric fine wires 320 to cause them to align in a common orientation. (Other orientation methods known to such arts as liquid crystal displays may also be used.) An alternating plurality of conductive metal contact strips 330 of a first type and conductive metal strips of a second type 332 are then placed on top of the piezoelectric fine wires 320, thereby securing them to the substrate 310. The materials of the metal strips 330 and 332 are chosen so that one type forms Schottky contact with ZnO and the other form Ohmic contact with ZnO. Also as shown in FIG. 3, the entire structure may be packaged inside a thin insulating layer 112 such as a layer of a wax or a flexible polymer to maintain its physical stability during the deformation of the substrate 110 and exposure to the environment.

Figure 4:
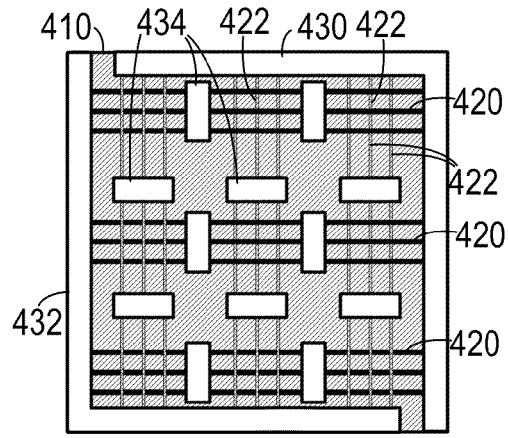
FIG. 4 is a plan view of a second multi-strand embodiment of a flexible generator.

Alternately, as shown in FIG. 4, a first plurality of piezoelectric fine wires 420 can be placed on the substrate 410 and moved into a common orientation. A plurality of intermediate contacts 434 can be used to secure the piezoelectric fine wires 420 to the substrate 410. A second plurality of piezoelectric fine wires 422 can then be added and moved in to a transverse orientation. A first L-shaped conductive contact 430 and second L-shaped conductive contact can then be applied to both the first plurality and the second plurality.

While piezoelectric fine wires of ZnO have been disclosed, other materials having a large piezoelectric coefficient, such as $Pb(Zr,Ti)O_3$. The flexible generators disclosed herein may be feasible to be implanted in muscles, embedded in cloths, built in surface layers, and placed in shoe pads.

An embodiment built around fibers is shown in FIGS. 5A-5D. This embodiment includes a self-powering nano-system that harvests its operating energy from the environment. It can be useful for sensing, personal electronics and defense technology. It is also feasible for nanodevices having low power consumption. As shown in FIG. 5A a first type of strand 500 may employ a fiber core 512, such as a para-aramid synthetic fiber (such as Kevlar® 129 fibers, available from Dupont), which has high strength, modulus, toughness and thermal stability.

In one embodiment a zinc oxide (ZnO) seed layer 516 is applied to the fiber core 512 and a plurality of monocrystalline ZnO nanowires 510 are grown radially outwardly from the seed layer 516. In one representative embodiment, all of the ZnO nanowires 510 are single crystalline and have a hexagonal cross-section with a diameter in the range of about 50-200 nm and a typical length of about 3.5 μm. The space between the nanowires 510 is of the order of a few hundreds nanometers, which is large enough for them to be bent for generating the piezoelectric potential. The tips of the nanowires 510 are separated from each other due to their small tilting angles ($<\pm 10°$), but their bottom ends are tightly connected. As a result, a continuous ZnO film at the roots of the nanowires 510 serves as a common electrode for signal output.

To maintain the high flexibility of the fiber core 512 after applying the seed layer 516 and growing the nanowires 510, a first layer of tetraethoxysilane (TEOS) 514 is infiltrated below the seed layer 516 and a second layer of TEOS 518 is infiltrated above the seed layer 516 near the base of the nanowires 510. The Si—O bonds in TEOS are highly reactive with the $OH^-$ groups on the ZnO surface, and organic chains of the TEOS firmly bind to the body of the aromatic polyamide fiber core 512. As a result, the ZnO seed layer 516 and the fiber core 512 are tightly bound to each other by the TEOS. Also, since TEOS easily forms cross linked chains, the nanowires 510 are firmly bundled and bound together at their roots and fixed on the ZnO seed layer 516. This prevents the nanowires 510 from scratching and stripping off during mechanical brushing and sliding. In one experimental embodiment, even when the fiber was looped into a circle of about 1 mm in diameter, no cracks, loose pieces or peel-offs were observed in the ZnO nanowires. At the bending area, the radial aligning morphology of the ZnO nanowires was also very well preserved, clearly demonstrating its toughness for mechanical deformations and bending.

A second type of strand 540 is shown in FIG. 5B, in which a ZnO seed layer 546 is applied to a fiber core 542 and a plurality of ZnO nanowires 548 is grown outwardly radially therefrom. An inner TEOS layer 544 and an outer TEOS layer 550 is applied thereto and then a conductive metal layer 552 (such as gold) is applied to the exposed nanowires 548, leaving metallic tips 553 at the ends of the nanowires 548. As shown in FIG. 5D, this type of strand 540 can be intertwined with the type of strand 500 shown in FIG. 5A to form a generating yarn 560. A first conductive contact 532 is coupled to the first type of strand 500 and a second conductive contact 534 is coupled to the second type of strand 540.

When these the first type of strand 500 moves laterally relative to the second type of strand 540, the piezoelectric nanowires 510 in the first type of strand 500 bend, thereby generating a voltage potential across them. Contact with the metallic tips 553 creates a Schottky barrier that acts as a diode.

Figure 6:
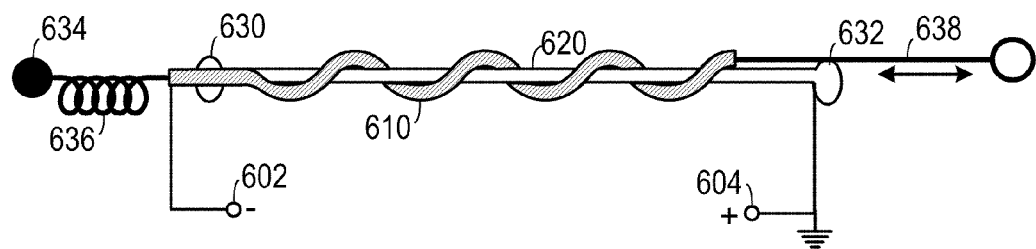
FIG. 6 is an elevational view of one embodiment of a fibrous generator.

As shown in FIG. 6, in one experimental embodiment of a fibrous generator, a spring 636 is attached to a fixed surface 634. A strand of the first type 610 is intertwined with a strand of the second type 620 and is attached to the spring 636. A first electrical contact 602 is coupled to the strand of the first type 610. A second electrical contact 604 is coupled to the strand of the second type 620. The strand of the second type 620 is affixed between two fixed surfaces 630 and 632. A string 632 is affixed to the strand of the first type 610. As the string 638 is pulled and released laterally, relative movement between the fiber of the first type 610 and the fiber of the second type 620 result in the generation of electricity.

In this experimental design, the gold coated ZnO nanowires acted as an array of scanning metal tips that deflected the ZnO nanowires rooted at the other strand. A coupled piezoelectric and semiconducting property resulted in the charge creation and accumulation and charge release process. The gold coating completely covered the ZnO nanowires and formed a continuous layer along the entire fiber. Once the two strands were firmly entangled together, some of the gold coated nanowires penetrated slightly into the spaces between the uncoated nanowires rooted at the other strand. When there was a relative sliding/deflection between them, the bending of the uncoated ZnO nanowires produced a piezoelectric potential across their width, and the gold coated nanowires acted as the "zigzag" electrode as for the DC nanogenerator as disclosed in U.S. patent application Ser. No. 11/608,865 for collecting and transporting the charges.

Analogous to the case of deflecting a nanowire by an atomic force microscope (AFM) tip, when the top fiber moves to the right-hand side, for example, the gold coated nanowires bend the uncoated ZnO nanowires to right-hand side (for simplicity of description, we assume that the gold coated nanowires are much stiffer and suffer little bending). Piezoelectric potential is thus generated across the uncoated nanowire due to its piezoelectric effect, with the stretched surface positive ($V^+$) and the compressed surface negative ($V^-$). The positive potential side has a reversely biased Schottky contact with gold and thus prevents the flow of current, while the negative potential side has a forward biased Schottky contact with the gold and it allows the current to flow from the gold to the nanowire. Since the density of the nanowires is high, it is very likely that a bent nanowire rooted at the uncoated fiber touches the backside of another gold coated nanowire after subjecting to bending. In this case, the negative potential surface of the ZnO nanowire contacts the gold layer, so the Schottky barrier at the interface is forward biased, resulting in a current flowing from the gold layer into the ZnO nanowire. Then, when the top strand keeps moving further towards the right-hand side, the gold coated nanowires scan across the ZnO nanowires tip and reach their negatively charged side. Therefore, more current will be released through the forward biased Schottky barrier. This means that the currents from all of the nanowires will add up constructively regardless the nanowire being deflected to which direction even in the same cycle of pulling. The output voltage is defined by the characteristic of one nanowire, and the sign of the voltage does not change in responding to the deflection configuration of the nanowire due to the rectifying effect of the Schottky barrier at the gold-ZnO interface. The same effect is expected if the top fiber is driven to retract toward the left-hand-side. Due to the similar mechanical property of the top and bottom nanowires, the gold coated nanowires could also be possibly bent by the nanowires rooted at the uncoated fiber, but this does not affect the mechanism presented above. For the gold coated fiber, all of the nanowires are completely covered by a thick gold layer, and they can be considered as an equal potential electrode connected to the external measurement circuit. Thus, the role played by the ZnO nanowires was as a template for supporting the gold coating and no piezoelectric charges will be preserved inside the gold coated nanowires.

Figure 7A:
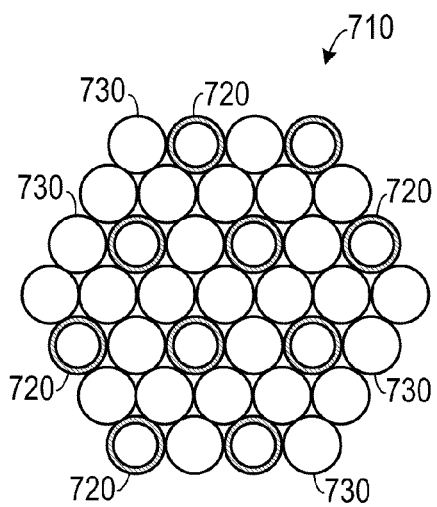
FIG. 7A is a pan view of generating yarns interwoven to form a generator fabric.
Figure 7B:
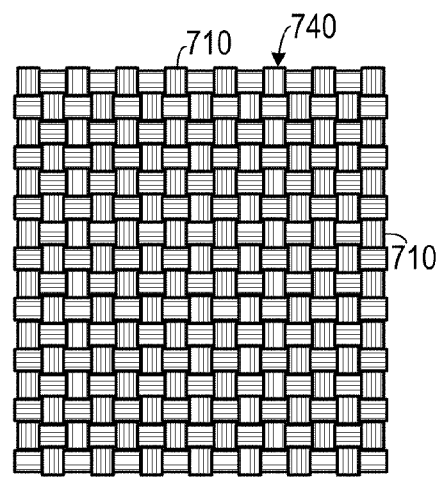
FIG. 7B is a cross-sectional view of an example of a generating yarn.

As shown in FIGS. 7A and 7B, a yarn 710 can be made from alternating strands of the first type 720 and strands of the second type 730. This yarn 710 may be interwoven to create a fabric 740. Thus, the fabric 740 could be formed into a clothing item or incorporated in a tire, or other object, and can be used to generate electricity from mechanical energy harvested from the movement of the fabric 740.

Figure 8:
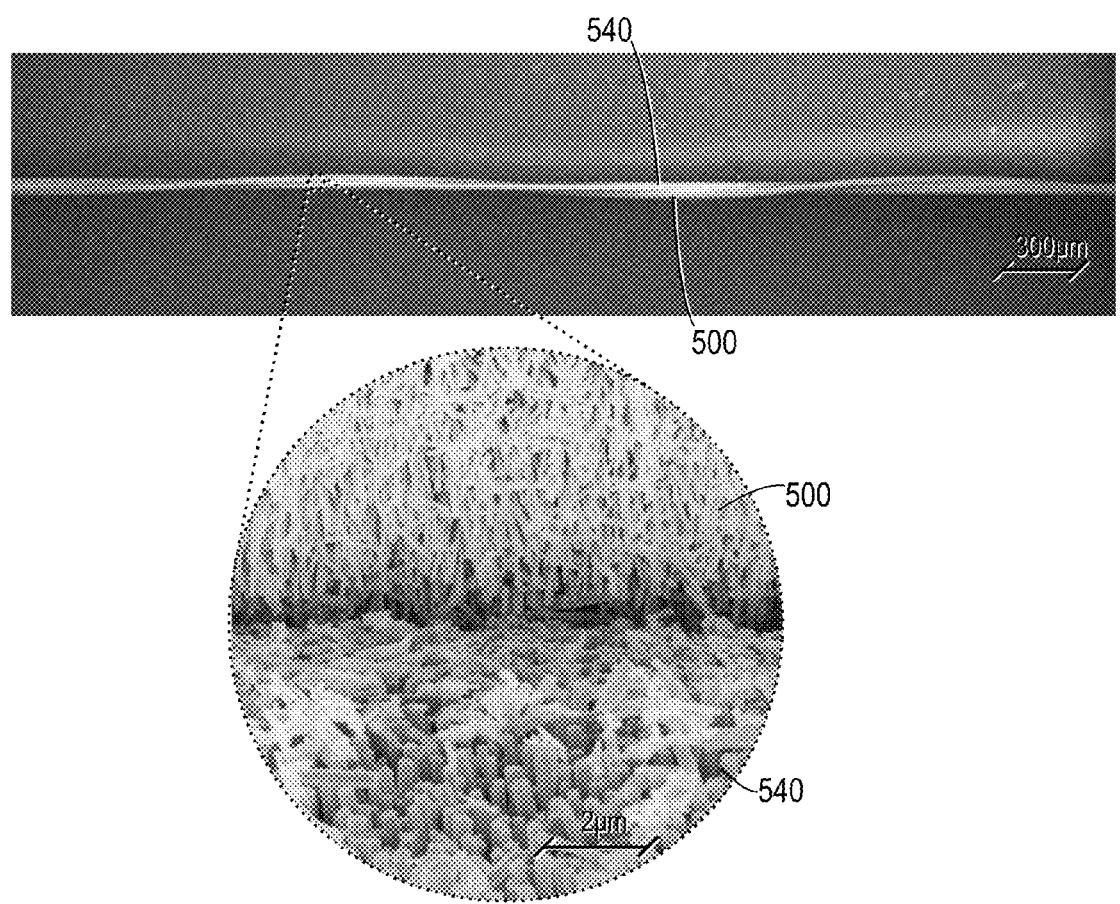
FIG. 8 is a micrograph of a generating yarn.

As shown in FIG. 8, a micrograph shows a strand of the first type 540 intertwined with a strand of the second type 540. Using ZnO nanowires grown on fibers, it is possible to fabricate flexible, foldable, wearable and robust power source in any shape (such as "power shirt"). The output electricity can be dramatically enhanced using a bundle of fibers as a yarn, which is the basic unit for fabrics. The optimum output power density from textile fabrics can be estimated based on experimental data indicates that the fabric would be capable of generating an output density of 20-80 mW per square meter of fabric. The nanogenerator operates at low-frequency in the range of conventional mechanical vibration, such as foot steps and heart beats. The ZnO nanowire arrays can be grown using chemical synthesis at 80° C. on a many types of substrates.

In one experimental embodiment, the ZnO nanowires were grown radially around Kevlar® 129 fibers through a hydrothermal approach. The as-grown ZnO nanowires were then chemically bonded to the fiber surface as well as to each other by coating with tetraethoxysilane (TEOS). The double-fiber NG was assembled by entangling a fiber covered with as-grown nanowires around the other fiber covered with gold coated nanowires. By holding the two ends of one fiber, and sliding the other fiber back and forth, a relative brushing motion between the two fibers produced output current due to a coupled piezoelectric-semiconducting properties.

The fibers cores used in the experiments were Kevlar 129 fibers of 14.9 μm in diameter. First, the fibers were cleaned in acetone then ethanol under sonication for 5 minutes each. A 100 nm-thick ZnO seed layer was uniformly coated around the fiber using magnetron sputtering. ZnO nanowires were then grown radially on the fiber surface via a hydrothermal approach by immersing the fibers in the reactant solution at 80° C. The reactant solution was prepared by dissolving 0.1878 g of $Zn(NO_3)_2 \cdot 6H_2O$ and 0.0881 g of hexamethylenetetramine (HMTA) in 250 mL deionized water at room temperature. The concentration of each in the solution was 0.025 mol/L. After 12-hour aging in the solution, the fibers turned into white, indicating that they were covered by dense ZnO nanowires. Finally, they were rinsed with deionized water for several times and baked at 150° C. for 1 hour. The as-synthesized ZnO NW-coated fibers were immersed in 99.9% tetraethoxysilane (TEOS) for 2-3 minutes. Because the as-deposited ZnO seed layer usually has some cracks due to its incompatibility with the fiber, capillary force can attract TEOS flew through the cracks to reach the interface between the ZnO seed layer and the fiber as well as the roots of the nanowires. Thus, two layers of TEOS above and below the ZnO seed layer were formed.

A typical double-fiber nanogenerator was assembled using two 3 cm-long ZnO nanowire coated fibers, one coated with gold and one as-grown. The gold layer was coated by a DC sputtering system. During the sputtering, the fiber was fixed on the stage at one end and its body was left freestanding. Therefore, a fairly uniform gold coating was achieved along entire fiber by rotating the sample stage. Generally, the thickness of the gold coating was 300±20 nm, which was read by a quartz thickness monitor equipped inside the sputtering system. In assembling the double-fiber nanogenerator, both ends of the as-grown ZnO nanowire fiber were fixed on a glass substrate with one end grounded and electrically connected to an external measurement circuit as the nanogenerator's output anode. One end of the gold coated fiber was attached to a small spring, which was affixed to the substrate; while the other end was attached to a pulling string so that it can freely move back and forth. The gold coated fiber was electrically connected to the external circuit as the nanogenerator's output cathode. The effective length of the fiber NG was 4-5 mm and typically contained nine cycles, where each cycle was about 500 μm in length.

In one experimental embodiment, with an output current of 4 nA using a surface coated fiber, and for an average output voltage of 3 mV the output power P=4 nA×3 mV=12 pW. The area of contact between the two adjacent fiber is A=5 um×5 mm. Thus, the total output power per unit contact area: p=P/A=0.5×10−3 W/m². For a typical Kevlar 29 Style 735 Ballistic Fabric: the fiber radius r=10 μm, number of filaments per yarn is 1000, the diameter of the yarn is estimated to be R=(1000)½ r=316 μm. The total length of yarn to make 1 square meter fabric is: 1 m²/2R=1580 m, where a factor of 2 is introduced to consider the double count of the contact area between the fibers. Consider the hexagonal close packing among the fibers (see figure above), if the average contact width between the fiber is about r, the total contact area among the fibers for 1 square meter of fabric is: A1=1580 m×1000×(r)=7.9 m². The power generated by such a large contact area is: A1 P=7.9*(0.5×10⁻³)=3.8 mW, which is the output power of 1 m² fabric.

The above described embodiments, while including the preferred embodiment and the best mode of the invention known to the inventor at the time of filing, are given as illustrative examples only. It will be readily appreciated that many deviations may be made from the specific embodiments disclosed in this specification without departing from the spirit and scope of the invention. Accordingly, the scope of the invention is to be determined by the claims below rather than being limited to the specifically described embodiments above.

What is claimed is:

1. A small scale electrical generator, comprising:
   a. an elongated substrate;
   b. a first piezoelectric fine wire disposed along a surface of the substrate, the first piezoelectric fine wire having a first end and a spaced-apart second end; and
   c. a first conductive contact securing the first end of the fine wire to a first portion of the substrate and a second conductive contact securing the second end of the fine wire to a second portion of the substrate, wherein at least one of the first conductive contact and the second conductive contact including a material that exhibits a band gap with respect to the first piezoelectric fine wire so as to form a Schottky barrier therebetween.

2. The small scale electrical generator of claim 1, wherein the substrate comprises a polyimide film.

3. The small scale electrical generator of claim 1, wherein the first piezoelectric fine wire comprises a fine wire selected from a group consisting of a nanowire and a microwire.

4. The small scale electrical generator of claim 1, wherein the first piezoelectric fine wire comprises zinc oxide.

5. The small scale electrical generator of claim 1, wherein the first conductive contact and the second conductive contact each comprise a metal.

6. The small scale electrical generator of claim 5, wherein the metal comprises silver.

7. The small scale electrical generator of claim 1, further comprising:
   a. a second piezoelectric fine wire, having a first end and a spaced-apart second end, disposed along the surface of the substrate and extending from the second conductive contact; and
   b. a third conductive contact securing the second end of the second piezoelectric fine wire to the substrate.

8. The small scale electrical generator of claim 7, wherein the second piezoelectric fine wire comprises a fine wire selected from a group consisting of a nanowire and a microwire.

9. The small scale electrical generator of claim 7, wherein the second piezoelectric fine wire comprises zinc oxide.

10. A fibrous electrical generator, comprising:
    a. a first elongated strand from which a plurality of piezoelectric nanowires extend radially outwardly therefrom, each piezoelectric nanowire including a proximal end secured to the first elongated strand and an opposite distal end, a first conductive contact in electrical communication with the first elongated strand;
    b. a second elongated strand, intertwined with the first elongated strand, each second elongated strand including a plurality of elongated conductive nanostructures extending radially outwardly therefrom, each of the plurality of conductive nanostructures having a first end secured to the second elongated strand and a opposite second end, a second conductive contact in electrical communication with the second elongated strand,
    the second elongated strand disposed relative to the first elongated strand so that relative motion between the first elongated strand and the second elongated strand causes a set of the piezoelectric nanowires extending from the first elongated strand to bend, thereby creating a voltage potential differential across each of the set of piezoelectric nanowires, and so that a Schottky barrier is formed between at least one of the set of piezoelectric nanowires and at least one of the elongated conductive nanostructures, thereby causing a charge transfer from the at least one of the set of piezoelectric nanowires to the at least one of the elongated conductive nanostructures, thereby creating a voltage potential between the first conductive contact and the second conductive contact.

11. The fibrous electrical generator of claim 10, wherein the first elongated strand comprises:
    a. a para-aramid synthetic fiber;
    b. a first tetraethoxysilane sheath disposed about the para-aramid synthetic fiber;
    c. a zinc oxide seed layer disposed about the tetraethoxysilane sheath, a plurality of elongated zinc oxide nanowires extending radially outwardly therefrom; and
    d. a second tetraethoxysilane sheath disposed about the zinc oxide seed layer and configured to support a base portion of the elongated zinc oxide nanowires.

12. The fibrous electrical generator of claim 10, wherein the second elongated strand comprises:
    a. a para-aramid synthetic fiber;
    b. a first tetraethoxysilane sheath disposed about the para-aramid synthetic fiber;
    c. a zinc oxide seed layer disposed about the tetraethoxysilane sheath, a plurality of elongated zinc oxide nanowires extending radially outwardly therefrom;
    d. a second tetraethoxysilane sheath disposed about the zinc oxide seed layer and configured to support a base portion of the elongated zinc oxide nanowires; and
    e. a metallic layer coating the elongated zinc oxide nanowires.

13. The fibrous electrical generator of claim 10, wherein a plurality of interwoven first elongated strands and second elongated strands are interwoven to form a fabric.

* * * * *

UNITED STATES PATENT AND TRADEMARK OFFICE
CERTIFICATE OF CORRECTION

PATENT NO.       : 7,982,370 B2
APPLICATION NO.  : 12/209310
DATED            : July 19, 2011
INVENTOR(S)      : Wang et al.

It is certified that error appears in the above-identified patent and that said Letters Patent is hereby corrected as shown below:

Col. 1, line 19 - after "Health", please insert: -- . The Government has certain rights in the invention. --

Signed and Sealed this
Twentieth Day of September, 2011

David J. Kappos
*Director of the United States Patent and Trademark Office*